United States Patent
Glassl et al.

(10) Patent No.: US 12,295,127 B2
(45) Date of Patent: May 6, 2025

(54) THERMAL COUPLING ELEMENT

(71) Applicant: AUDI AG, Ingolstadt (DE)

(72) Inventors: Christoph Glassl, Munich (DE); Christian Gert Voigt, Usingen (DE)

(73) Assignee: AUDI AG, Ingolstadt (DE)

( * ) Notice: Subject to any disclaimer, the term of this patent is extended or adjusted under 35 U.S.C. 154(b) by 233 days.

(21) Appl. No.: 18/153,857

(22) Filed: Jan. 12, 2023

(65) Prior Publication Data

US 2023/0225088 A1     Jul. 13, 2023

(30) Foreign Application Priority Data

Jan. 13, 2022 (DE) .......................... 102022100684.0

(51) Int. Cl.
    *H05K 7/20*      (2006.01)

(52) U.S. Cl.
    CPC ....... *H05K 7/20854* (2013.01); *H05K 7/2049* (2013.01); *H05K 7/20454* (2013.01)

(58) Field of Classification Search
    CPC ............. H05K 7/2039; H05K 7/20436; H05K 7/20445; H05K 7/20454; H05K 7/20472; H05K 7/2049; H05K 7/20854; H05K 7/209

See application file for complete search history.

(56) References Cited

U.S. PATENT DOCUMENTS

| | | | |
|---|---|---|---|
| 6,257,758 B1 * | 7/2001 | Culbertson | G01K 7/02 |
| | | | 374/E7.004 |
| 7,752,866 B2 * | 7/2010 | Vaidyanathan | B64G 1/50 |
| | | | 337/393 |
| 2011/0083431 A1 * | 4/2011 | Mankame | F03G 7/065 |
| | | | 60/527 |
| 2013/0314202 A1 | 11/2013 | Bolton | |
| 2015/0042443 A1 * | 2/2015 | Mitschele | H01H 37/54 |
| | | | 337/365 |
| 2020/0136209 A1 | 4/2020 | Dede et al. | |
| 2023/0079600 A1 * | 3/2023 | Ogawa | G01R 1/06722 |
| | | | 439/66 |

FOREIGN PATENT DOCUMENTS

| | | |
|---|---|---|
| DE | 102010015743 A1 | 1/2011 |
| DE | 102012208767 A1 | 12/2012 |
| DE | 102019103619 A1 | 8/2020 |

* cited by examiner

*Primary Examiner* — Zachary Pape
*Assistant Examiner* — Steven Ngo
(74) *Attorney, Agent, or Firm* — Seed IP Law Group LLP

(57) ABSTRACT

The present disclosure relates to a thermal coupling element, a method of manufacturing the coupling element, and a switchable arrangement for heat dissipation from electrical or electronic components of a motor vehicle.

8 Claims, 1 Drawing Sheet

THERMAL COUPLING ELEMENT

BACKGROUND

Technical Field

Embodiments of the invention relate to a thermal coupling element, a method of manufacturing the coupling element, and a switchable arrangement for heat dissipation from electrical or electronic components of a motor vehicle.

Description of the Related Art

Ever-increasing power and packing densities increase the thermal design power of electrical and electronic components in motor vehicles. As rising temperature levels reduce the performance and service life of the components, cost-effective measures for heat dissipation from the components are becoming increasingly important.

Within electrical and electronic components, so-called thermal interface materials (TIM) are often used to improve heat transfer between the printed circuit board (PCB) and the heat sink or alternatively housing. To improve the heat transfer from the outside of the component to the environment, the incorporation of heat sink structures (ribbing), the use of fans, heat-dissipating surface coatings and liquid cooling concepts are used. Occasionally, heat pipes are also used.

These measures do not utilize the cooling effect of the outer surfaces of the vehicle for heat dissipation from the control units. Thermal interface materials, for example, heat conducting pads, cannot be used in their standard design for connecting an electrical or electronic component to the outer surfaces of the vehicle. They would indeed provide a cooling effect in the case of low external temperatures. However, since this is a permanent connection, additional heat would be conducted into the electrical or electronic component at high outside temperatures.

DE 10 2019 103 619 A1 relates to a heat transfer device for transferring heat, comprising an upper housing part and a lower housing part for receiving a foam element, which define a first interior space in which the foam element and a phase transition material, which is at least partially received by the foam element, are arranged. The heat transfer device is adapted to transfer heat by means of circulation of the phase transition material.

A system for regulating the temperature of a battery having an outer surface is known from DE 10 2010 015 743 A1. The system comprises a reservoir coupled to the external surface of the battery and a phase change material thermally coupled to the external surface of the battery and retained by the reservoir. In one variant, the phase change material is encapsulated in the outer wall.

US 2020/136 209 A1 discloses a battery module having a battery cell and a thermal management system for dissipation of heat from the battery cell. The thermal management system comprises two or more elementary cells in an array. Each unit cell comprises a primary shell comprising a primary phase change material (PCM) and a secondary shell comprising a secondary phase change material that is thermally coupled to the primary shell. The battery cell is thermally coupled to the primary shell at a heat transfer interface, and the elementary cells adjacent to the secondary shells in the array are separated.

BRIEF SUMMARY

Some embodiments provide a passive, temperature-dependent switchable coupling element for the thermal connection of electrical and electronic components to an outer surface of a vehicle, in order to exclusively utilize the cooling effect of the outer surface of the vehicle during a specific driving situation, for example, during driving operation.

Some embodiments include a thermal coupling element for heat dissipation from electrical or electronic components in a motor vehicle (for example, high-performance computers, power electronics, vehicle surrounding sensors, battery modules). The coupling element is particularly suitable for components installed in the immediate vicinity of the vehicle exterior (for example, in the vicinity of the windshield or the body).

The thermal coupling element comprises metal sheets between which compression springs are arranged. In one embodiment of the coupling element, the metal sheets and the compression springs are realized by a single metal sheet, which is formed by bending processes into a casing body with integrated compression spring plates. In another embodiment, two metal sheets are connected by compression springs, which are formed by stamping or laser processing. In a further embodiment, the material of the compression springs differs from the material of the metal sheets.

At least one shape memory wire is incorporated within the coupling element, which shape memory wire forms a temperature-dependent actuating mechanism together with the compression springs. The space between the metal sheets is filled with a compressible heat conducting medium. In one embodiment, the heat conducting medium comprises an elastomer with high heat transfer properties. In a special embodiment, the heat conducting medium comprises a closed-cell silicone foam.

In one embodiment, the upper surface of the coupling element has at least one recess through which the at least one shape memory wire is guided. The recesses are configured in such a way that the largest part of the length of the at least one shape memory wire is located within the recesses of the thermal coupling element.

The lower side of the thermal coupling element is provided with a layer of an elastic, thermally conductive material. In one embodiment, the elastic thermally conductive material does not conduct electric current.

The upper side of the thermal coupling element is provided with an adhesive layer by means of which adhesive layer the coupling element can be attached to the inner side of an outer surface of a vehicle (for example, a windshield or the car body). The damping properties of the layers on the upper and lower sides of the coupling element counteract the transmission of critical excitation frequencies and protect against the introduction of external interference, for example, due to vibration.

In one embodiment, a layer of a heat conducting medium is arranged between the upper metal sheet and the adhesive layer.

In one embodiment, the thermal coupling element is realized as a single element. In another embodiment, the thermal coupling element is realized as a two-dimensional combination of a plurality of coupling elements arranged next to one another. The dimensions of the thermal coupling element are scalable.

The thermal coupling element can switch between high and low thermal transfer resistance by means of an actuating mechanism with integrated shape memory wire. The actuating mechanism uses the two-way effect of a shape memory alloy.

At high temperature on the upper side of the thermal coupling element, the coupling element is compressed by means of the activated shape memory wire. At low temperature, the thermal coupling element is stretched in a vertical direction to its upper side.

If the temperature rises above a certain material-dependent threshold (for example, 60° C.), the shape memory wire changes to its austenitic high-temperature phase. The shape memory wire contracts and exerts a tensile force on the lower metal sheet of the coupling element, which tensile force prevails over the force of the compression springs. The coupling element is compressed and separates the outer surface of the vehicle from the electrical or electronic component. The resulting air gap prevents high heat input from the outer surface of the vehicle into the electrical or electronic component.

If the temperature on upper side of the thermal coupling element is below a certain material-dependent threshold (for example, 40° C.), the shape memory wire is in its martensitic low-temperature phase. In this low-temperature phase, the shape memory wire has its greatest expansion and the force of the compression springs is greater than the tensile force exerted by the shape memory wire on the lower metal sheet of the coupling element. The coupling element is therefore stretched in the vertical direction and connects the outer surface of the vehicle to the electrical or electronic component to be cooled.

The thermal coupling element does not contain any phase transition material that can change to the liquid or gaseous state and therefore offers the advantage that the heat conducting medium does not need to be sealed off from the surrounding components through the use of comparatively complex measures. The thermal coupling element moreover offers the advantage of being easy to manufacture.

Some embodiments provide a method for manufacturing the thermal coupling element described herein. In the method, the outer shell of the thermal coupling element with incorporated compression springs and optionally a recess on the upper side of the outer shell is manufactured from a single sheet by a stamping and bending process. Thereinafter, at least one bent shape memory wire is inserted into the outer shell and its extremities are fixed to the bottom of the outer shell. Subsequently, the outer shell is filled out with a compressible heat conducting medium. In one embodiment, a layer of a heat conducting medium is applied to the top surface of the outer shell. Finally, an adhesive layer is applied to the top of the outer shell and a layer of an elastic, thermally conductive, is applied to the bottom of the outer shell.

Some embodiments provide an arrangement for switchable thermal coupling of an outer surface of the vehicle with at least one electrical or electronic component in the interior of the vehicle.

The arrangement comprises an outer surface of the vehicle, at least one coupling element, as described herein, attached to the inner side of the outer surface of the vehicle, and at least one electrical or electronic component in the interior of the vehicle, wherein the at least one electrical or electronic component is arranged such that the lower side of the at least one coupling element contacts an outer surface of the at least one electrical or electronic component and forms a heat conducting connection between the outer surface of the vehicle and the at least one electrical or electronic component when the temperature of the outer surface of the vehicle is less than the transition temperature from the martensitic to the austenitic phase of the at least one shape memory wire of the coupling element.

The thermal coupling element has a construction with high heat transfer properties and a temperature-dependent automatic actuating mechanism. Only at low ambient temperatures and when the vehicle is in motion does the thermal coupling element connect the electrical or electronic component to be cooled to the outer surface of the vehicle. When the vehicle is in motion, the thermal coupling element uses the low temperatures of the outer surfaces of the vehicle to cool the electrical or electronic components.

If the temperature of the outer surface of the vehicle is less than the transition temperature from the martensitic phase to the austenitic phase of the at least one shape memory wire of the coupling element, then the at least one shape memory wire is in its martensitic phase and the force of the compression springs is greater than the tensile force of the shape memory wire. The coupling element is stretched in the vertical direction and connects the outer surface of the vehicle to the electrical or electronic component to be cooled.

If the temperatures of the outer surface of the vehicle increase, for example, at high ambient temperatures or when stationary or in "stop-and-go" traffic, then the thermal coupling element separates automatically and prevents the entry of high temperatures that reduce the performance and service life of electrical or electronic components. The temperature-dependent actuating mechanism is operated quietly and passively, without requiring additional energy.

If the temperature of the outer surface of the vehicle is greater than the transition temperature of the at least one shape memory wire from the martensitic to the austenitic phase of the coupling element, the at least one shape memory wire is in its austenitic phase and the tensile force of the shape memory wire is greater than the force of the compression springs. The thermal coupling element is compressed and separates the outer surface of the vehicle from the electrical or electronic component. The resulting air gap prevents high heat input from the outer surface of the vehicle to the electrical or electronic component.

The arrangement described herein offers the advantage that at high outside temperatures there is no mechanical connection between the outer surface of the vehicle and the component from which heat is to be dissipated. This makes it possible to achieve more efficient thermal decoupling, which is to say, higher heat transfer resistance in the event of high outside temperatures. The direct connection to the vehicle exterior makes it possible to avoid heat input at high outside temperatures, especially when the vehicle is stationary or in "stop-and-go" driving mode. Further advantages and embodiments will be apparent from the description and the accompanying drawings.

It is understood that the features mentioned above and those to be explained below can be used not only in the respectively indicated combination, but also in other combinations or on their own.

BRIEF DESCRIPTION OF THE SEVERAL VIEWS OF THE DRAWINGS

Embodiments are shown in the drawings, and are further described with reference to the drawings.

DETAILED DESCRIPTION

Figure 1:
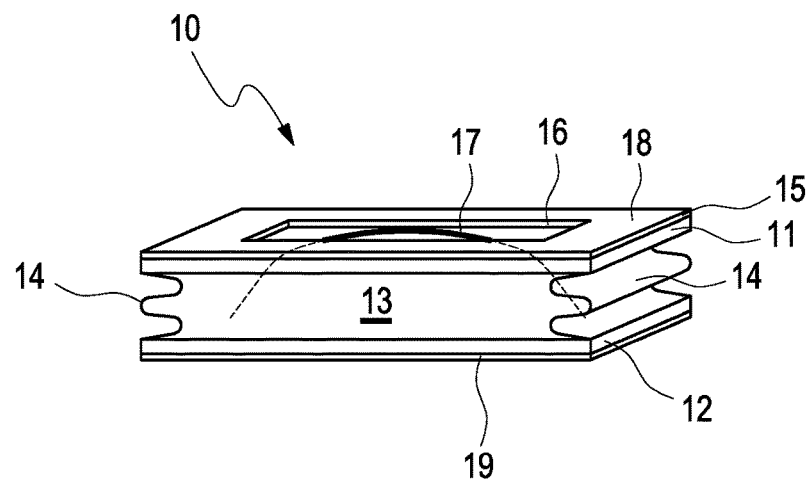
FIG. 1 shows a schematic representation of an embodiment of a coupling element.

FIG. 1 shows an embodiment of the thermal coupling element 10. The illustrated coupling element 10 comprises an upper metal sheet 11 and a lower metal sheet 12, between which there is a layer 13 of an elastic heat conducting medium. Compression springs 14 are arranged between the metal sheets 11, 12 to keep the metal sheets 11, 12 at a distance. On the upper side of the upper metal sheet 11 there is a second layer 15 of a heat conducting medium with a recess 16, in which recess a shape memory wire 17 is arranged, which forms an arc with its base on the lower metal sheet 12. There is an adhesive layer 18 on the second layer 15 of the heat conducting medium with the recess 16 which adhesive layer also has a recess 16. By means of the adhesive layer 18, the coupling element 10 can be attached to an inner surface of an outer surface of the vehicle 20, thereby applying additional tension to the shape memory wire 17. A layer 19 of an elastic, heat conducting medium is on the lower side of the lower metal sheet 12. A heat conducting connection to an electrical or electronic component 30 in the interior of the vehicle can be made by means of the layer 19 of the heat conducting medium to dissipate heat from the component 30. In the illustrated embodiment, the upper metal sheet 11, the lower metal sheet 12, and the compression springs 14 were formed from a single metal sheet by forming and stamping.

Figure 2:
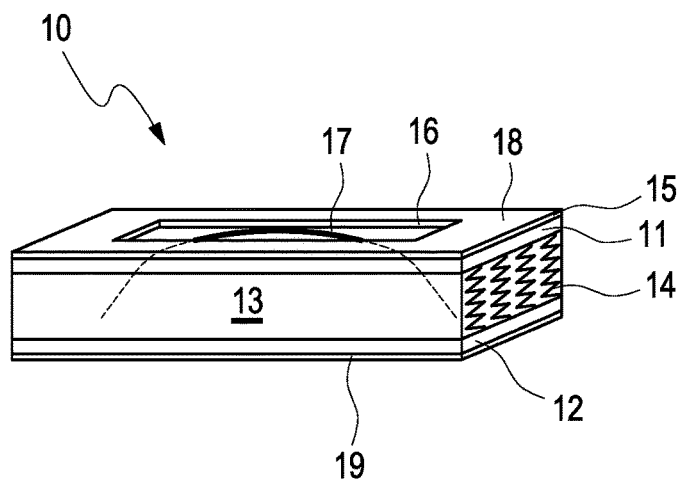
FIG. 2 shows a schematic representation of a further embodiment of a coupling element.

FIG. 2 shows another embodiment of the coupling element 10. In the illustrated embodiment, the compression springs 14 arranged between the metal sheets 11, 12 have a different construction. Instead of compression springs extending over the entire width of the coupling element 10, here several individual springs are installed.

Figure 3:
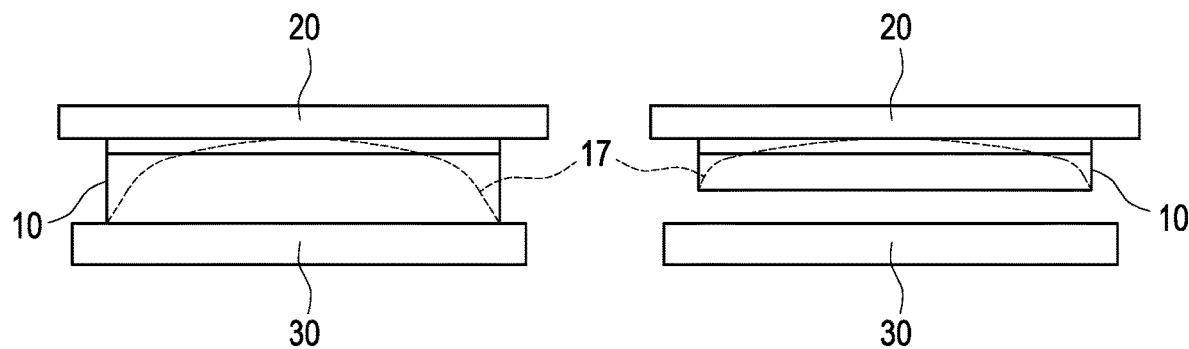
FIG. 3 shows a schematic representation of an embodiment of an arrangement and functioning of a coupling element.

FIG. 3 shows an embodiment of the arrangement described herein and illustrates the functioning of the coupling element described herein. A coupling element 10 is shown, which is fastened to the inside of an outer surface of the vehicle 20 and can form a heat conducting connection to an electrical or electronic component 30 in the interior of the vehicle.

The left-hand figure shows the arrangement when the outer surface of the vehicle 20 is cold. The shape memory wire 17 of the coupling element 10 is in the martensitic state. The force of the compression springs 14 is greater than the tensile force exerted by the shape memory wire 17 on the lower metal sheet 12 of the coupling element 10. The coupling element 10 forms a thermal bridge between the surface of the electrical or electronic component 30 and the outer surface of the vehicle 20, through which heat can be dissipated from electrical or electronic components 30.

The right-hand figure shows the arrangement when the outer surface of the vehicle 20 is hot. The shape memory wire 17 of the coupling element 10 is in the austenitic state. The shape memory wire 17 has contracted and is exerting a tensile force on the lower metal sheet 12 of the coupling element 10 that is greater than the force of the compression springs 14. The thickness of the coupling element 10 is reduced and it no longer contacts the surface of the electrical or electronic component 30. The resulting air gap between the outer surface of the vehicle 20 and the electrical or electronic component 30 has an insulating effect such that heat cannot transfer from the outer surface of the vehicle 20 to the electrical or electronic component 30.

German patent application no. 10 2022 100684.0, filed Jan. 13, 2022, to which this application claims priority, is hereby incorporated herein by reference in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A thermal coupling element, comprising:
   an upper metal sheet and a lower metal sheet between which compression springs are arranged,
   at least one shape memory wire which forms a temperature-dependent adjusting mechanism together with the compression springs,
   a compressible heat conducting medium, which fills a space between the upper metal sheet and the lower metal sheet,
   an adhesive layer arranged on an upper side of the upper metal sheet, and
   a layer of an elastic heat conducting medium arranged on a lower side of the lower metal sheet,
   wherein the upper metal sheet comprises a recess through which the at least one shape memory wire is guided, and
   wherein a largest length portion of the at least one shape memory wire is located within the recess.

2. The thermal coupling element according to claim 1, comprising a layer of a heat conducting medium arranged between the upper metal sheet and the adhesive layer.

3. The thermal coupling element according to claim 1, wherein the compressible heat conducting medium comprises an elastomer having heat transfer properties.

4. The thermal coupling element according to claim 3, wherein the compressible heat conducting medium comprises a closed-cell silicone foam.

5. The thermal coupling element according to claim 1, wherein the upper metal sheet, the lower metal sheet and the compression springs are formed by a single metal sheet.

6. The thermal coupling element according to claim 1, wherein a material of the upper metal sheet and the lower metal sheet is different from a material of the compression springs.

7. A system, comprising: the thermal coupling element of claim 1 and a second of the thermal coupling element of claim 1, the thermal coupling element and the second thermal coupling element arranged side by side.

8. An arrangement for a switchable thermal coupling of an outer surface of a vehicle to at least one electrical or electronic component in an interior of the vehicle, comprising:
   an outer surface of the vehicle,
   at least one thermal coupling element according to claim 1 attached to an inner side of the outer surface of the vehicle, and
   the at least one electrical or electronic component in the interior of the vehicle,
   wherein the at least one electrical or electronic component is arranged such that a lower side of the at least one thermal coupling element contacts an outer surface of the at least one electrical or electronic component and forms a heat conducting connection between the outer surface of the vehicle and
   the at least one electrical or electronic component when a temperature of the outer surface of the vehicle is less than a transition temperature from a martensitic to an austenitic phase of the at least one shape memory wire of the thermal coupling element.

* * * * *